(12) United States Patent
Li et al.

(10) Patent No.: US 9,711,690 B2
(45) Date of Patent: Jul. 18, 2017

(54) LED AND LED PACKAGING METHOD THEREOF

(71) Applicant: LEDMAN OPTOELECTRONIC CO., LTD., Shenzhen, Guangdong (CN)

(72) Inventors: Mantie Li, Guangdong (CN); Menglong Tu, Guangdong (CN); Qidi Xiang, Guangdong (CN); Han Liu, Guangdong (CN)

(73) Assignee: LEDMAN OPTOELECTRONIC CO., LTD., Shenzhen, Guangdong Province (CN)

( * ) Notice: Subject to any disclaimer, the term of this patent is extended or adjusted under 35 U.S.C. 154(b) by 69 days.

(21) Appl. No.: 14/895,834

(22) PCT Filed: Jun. 26, 2013

(86) PCT No.: PCT/CN2013/078010
§ 371 (c)(1),
(2) Date: Dec. 3, 2015

(87) PCT Pub. No.: WO2014/040445
PCT Pub. Date: Mar. 20, 2014

(65) Prior Publication Data
US 2016/0126425 A1    May 5, 2016

(30) Foreign Application Priority Data

Sep. 13, 2012  (CN) .......................... 2012 1 0339077

(51) Int. Cl.
*H01L 33/58*  (2010.01)
*F21V 5/04*  (2006.01)
(Continued)

(52) U.S. Cl.
CPC ............ *H01L 33/483* (2013.01); *H01L 33/54* (2013.01); *H01L 33/62* (2013.01); *F21V 5/04* (2013.01);
(Continued)

(58) Field of Classification Search
CPC ....... H01L 33/48–33/486; H01L 33/52–33/56; H01L 33/58; F21V 5/08;
(Continued)

(56) References Cited

U.S. PATENT DOCUMENTS 5,742,120 A * 4/1998 Lin .......................... H01L 33/54
257/E33.059
5,763,901 A * 6/1998 Komoto .................. H01L 33/54
257/666
(Continued)

FOREIGN PATENT DOCUMENTS

CN     101068034 A    11/2007
CN     101737709 A     6/2010
(Continued)

OTHER PUBLICATIONS

English Abstract of 10281236A.
(Continued)

*Primary Examiner* — Eric Ward
(74) *Attorney, Agent, or Firm* — Cheng-Ju Chiang

(57) ABSTRACT

An LED is provided, the LED comprising a lighting assembly and a light bead. The light head encases the lighting assembly. A cross-section of an upper portion of the light bead is an asymmetric shape with respect to the projection of a normal of the lighting assembly on the cross-section of the upper portion of the light bead, while a cross-section at the lower portion of the light bead perpendicular to the axis is a symmetric shape with respect to the projection of the normal of the lighting assembly on the cross-section at the (Continued)

lower portion of the light bead. The lighting assembly is located at a symcenter of the lower portion of the light bead. The aforementioned LED can increase its visible range, and can ensure an even distribution of the internal stress surrounding the lighting assembly. An LED packaging method is also provided.

11 Claims, 4 Drawing Sheets

(51) Int. Cl.
    *F21V 5/08*     (2006.01)
    *H01L 33/48*     (2010.01)
    *H01L 33/54*     (2010.01)
    *H01L 33/62*     (2010.01)

(52) U.S. Cl.
    CPC ....... *F21V 5/08* (2013.01); *H01L 2224/45144* (2013.01); *H01L 2224/48091* (2013.01); *H01L 2224/48247* (2013.01); *H01L 2924/181* (2013.01); *H01L 2933/005* (2013.01); *H01L 2933/0033* (2013.01); *H01L 2933/0066* (2013.01)

(58) Field of Classification Search
    CPC .......... F21V 5/04–5/048; Y10S 362/80; Y21Y 2101/02; G02B 19/0061–19/0066

USPC ....................................................... D26/124
See application file for complete search history.

(56) References Cited

U.S. PATENT DOCUMENTS

| | | | | |
|---|---|---|---|---|
| 7,829,899 | B2* | 11/2010 | Hutchins | ............. F21S 48/1747 257/79 |
| 2004/0037076 | A1* | 2/2004 | Katoh | ..................... H01L 33/54 362/235 |
| 2008/0198616 | A1* | 8/2008 | Lai | ........................... H01L 33/60 362/540 |
| 2009/0085053 | A1 | 4/2009 | Chen | |
| 2009/0225551 | A1* | 9/2009 | Chang | ...................... F21V 5/08 362/311.06 |

FOREIGN PATENT DOCUMENTS

| | | | | |
|---|---|---|---|---|
| CN | 10281236 A | 1/2013 | | |
| CN | 202884545 U | 4/2013 | | |
| JP | 11-154766 | * | 8/1999 | ............. H01L 33/00 |

OTHER PUBLICATIONS

English Abstract of 202884545 U.
English Abstract of 10737709 A.
English Abstract of 101068034A.

* cited by examiner

LED AND LED PACKAGING METHOD THEREOF

RELATED APPLICATION

This application is a national phase entry under 35 USC 371 of International Patent Application No PCT/CN2013/078010 filed on 26 Jun. 2013, which claims priority from Chinese Patent Application No. 201210339077.2 filed on 13 Sep. 2012, the disclosures of which are incorporated in their entirety by reference herein.

FIELD OF THE DISCLOSURE

The present disclosure relates to a display device, and more particularly, to an LED (light emitting diode) and a packaging method thereof.

BACKGROUND OF THE DISCLOSURE

An LED panel is often mounted perpendicular to the horizontal plane, forming an LED display screen. The maximum-brightness view of the LED panel is on its normal direction, and its half-power angle is symmetric with respect to its normal direction. The half-power angle, also known as a power angle, is the angle measured from the normal direction at the center of a light source at which the luminous intensity drops to half the central luminous intensity I, namely I/2. When the luminous intensity of the light source is evenly distributed, the angles, offset from the normal, at which the surrounding luminous intensities become half the original luminous intensity, should be equal. When the luminous intensity is not even, the angles are not equal. An emitting angle of a diode is its light diffusing angle. In addition, a display screen may be mounted at a certain height so that people's view may be a low-angle view. Since one needs to look up to the screen, the visible range of the LED display screen may be narrowed. In order to satisfy the requirements of low-angle view, certain tooling or jigs may be utilized when LED plug-ins are installed to deflect the LEDs downward for a certain angle, so as to increase the lower half-power angle, namely, to increase the angle at which the light is deflected downward. However, this method requires a re-customized die for the LED display screen, with a relatively high manufacturing cost and mean versatility.

SUMMARY OF THE DISCLOSURE

In light of the aforementioned, there is a need to provide an LED which can increase the visible range.

An LED is provided according to the disclosure, comprising:

a lighting assembly;

a light bead configured to encase the lighting assembly, where a cross-section of an upper portion of the light bead perpendicular to its axis is an asymmetric shape with respect to the projection of a normal of the lighting assembly on the cross-section of the upper portion of the light bead;

A cross-section at a lower portion of the light bead perpendicular to its axis is a symmetric shape with respect to the projection of the normal of the lighting assembly on the cross-section at the lower portion of the light bead, and the lighting assembly is located at a symcenter of the lower portion of the light bead.

In one embodiment, the asymmetric shape comprises a first semi-ellipse and a second semi-ellipse, where a first semi-elliptical curve of the first semi-ellipse and a second semi-elliptical curve of the second semi-ellipse connect end to end, the curvature of the first semi-elliptical curve is different from that of the second semi-elliptical curve, and an intersection line of the first semi-elliptical curve and the second semi-elliptical curve intercepts with the normal of the lighting assembly.

In one embodiment, a major axis of the first semi-ellipse is equal to that of the second semi-ellipse, and a minor axis of the first semi-ellipse is shorter than that of the second semi-ellipse.

In one embodiment, the outer surface of the light bead comprises a first curved lighting surface and a second curved lighting surface, where the portion of the outer surface of the light bead that corresponds to the first semi-ellipse is the first curved lighting surface, and the portion of the outer surface of the light bead that corresponds to the second semi-ellipse is the second curved lighting surface, and a ratio of the half-power angle of the first curved lighting surface to that of the second curved lighting surface lies in a range of 1:1.5~5.

In one embodiment, the symmetric shape is an ellipse.

In one embodiment, the outer surface of the light bead comprises four curved surfaces connecting with each other.

In one embodiment, every two adjacent curved surfaces among the four curved surfaces connect tangentially with each other.

In one embodiment, the lighting assembly comprises a post and a chip disposed on the post.

In one embodiment, the post seats at a central region of the lower portion of the light bead.

A LED packaging method is also provided.

The LED packaging method comprises:

crystal fixation, where a chip is fixed onto a post;

wire bonding, where both terminals of a gold wire are welded respectively to the chip and the post;

fluid resin filling, where the chip and the post are placed in the mold which is then filled with fluid resin, axial a cross-section of the resin-filled cavity perpendicular to its axis is an asymmetric shape, and a cross-section of an opening of the resin-filled cavity perpendicular to its axis is a symmetric shape;

curing, where the fluid resin is cured to form the LED.

Compared to a conventional LED, the LED manufactured using the LED packaging method according to the disclosure has at least the following advantages:

First, the cross-section of the upper portion of the light bead perpendicular to its axis is an asymmetric shape with respect to the projection of the normal of the lighting assembly on the cross-section of the upper portion of the light bead so that the outer curved surface of the light bead is not symmetric about the normal of the lighting assembly. Accordingly, the refraction of light is asymmetric, hence the facula generated by the light bead is an asymmetric one. Furthermore, the axial cross-section at the lower portion of the light bead perpendicular to its axis is a symmetric shape with respect to the projection of the normal of the lighting assembly on the cross-section at the lower portion of the light bead. Thus, the lighting assembly is located at the symcenter of the lower portion of the light bead. Since the light bead leads to an asymmetric refraction of light, when the light bead is cured and shaped up, the distribution of internal stress in the light bead is not uniform. However, the lower portion of the light bead is designed to be a symmetric shape so as to enable the distribution of the internal stress in the light bead to be relatively uniform, in order to prevent in the molding process of the light bead the introduced fluid resin from flowing and striking the lighting assembly which may otherwise influence the configuration of the lighting assembly and the connections among the various components and thus harm the LED's quality.

A ratio of the half-power angle of the first curved lighting surface to that of the second curved lighting surface equals 1:1.5~5, which thus increases the visible range of the LED. Furthermore, the chip is disposed inside a bowl in the negative electrode pin, enabling the second curved lighting surface with a relatively larger half-power angle to form a lower half-power angle to increase the lower half-power angle of the aforementioned LED and thus to better meet the requirements of low angle view.

Also, the lighting assembly is located at the central region of the lower portion of the light bead. Since the cross-section at the lower portion of the light bead perpendicular to its axis is a symmetric shape and the lighting assembly is located at the central region of the lower portion of the light bead, the resin surrounding the lighting assembly will be symmetric about the lighting assembly, and the internal stress of the lighting assembly will be uniform, with a relatively high stability, thus preventing, when the light bead is heated or an external force is applied on the light bead, the lighting assembly from detaching from the light bead which may influence the working of the LED.

DETAILED DESCRIPTION OF THE DISCLOSURE

To facilitate an understanding of the disclosure, hereinbelow the disclosure will be described in more fully detail with reference to the accompanying drawings. Preferred embodiments of the disclosure are provided in the accompanying drawings. However, the disclosure may also be implemented in a number of different forms, and thus is not limited to the embodiments described herein. Rather, these embodiments are intended to allow a more thorough understanding of the disclosure.

It should be noted that, when a component is mentioned to be "fixed" on another component, it may be fixed directly on the another component, or there may be an intermediate component. Similarly, when a component is regarded as "connected" to another component, it may be connected directly to the another component, or there may be an intermediate component. Terms "vertical", "horizontal", "left", "right" and other similar phrases used herein are for illustrated purposes only, and should not be construed to be the only implementation.

Unless otherwise defined, all technical and scientific terms used herein have the same meaning as commonly understood by those of ordinary skill in the art. Terms used in the specification of the disclosure are for purposes of illustrating specific embodiments, but should not be construed in a limiting sense. Term "and/or" used herein comprises any and all combinations of one or more relevant items listed.

Figure 1:
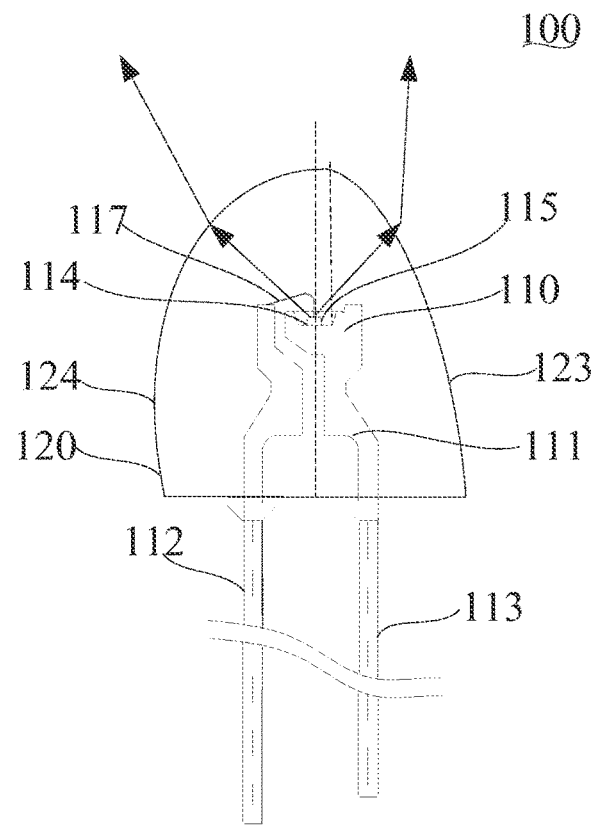
FIG. 1 is a cross-sectional view of an LED according to an embodiment of the disclosure.

Referring now to FIG. 1, an LED 100 according to an embodiment of the disclosure comprises a lighting assembly 110 and a light bead 120.

The lighting assembly 110 comprises a post 111, a crystal-fixing adhesive 114, a chip 115 and a gold wire 117. The post 111 comprises a positive electrode pin 112 and a negative electrode pin 113, where a bowl (not shown) is defined in the positive electrode pin 112 or the negative electrode pin 113, and the chip 115 is accommodated inside the bowl. The post 111 is seated at the central region of the lower portion of the light bead 120.

The chip 115 is fixed on the crystal-fixing adhesive 114. Both terminals of the gold wire 117 are connected respectively to the positive electrode pin 112 and the chip 115.

The light bead 120 encases the lighting assembly 110. A cross-section of an upper portion of the light bead 120 perpendicular to its axis is an asymmetric shape with respect to the projection of a normal of the lighting assembly 110 on the cross-section of the upper portion of the light bead 120, while an axial cross-section at the lower portion of the light head 120 perpendicular to its axis is a symmetric shape with respect to the projection of the normal of the lighting assembly 110 on the cross-section at the lower portion of the light bead 120. The lighting assembly 110 is seated at a symcenter of the lower portion of the light bead 120.

Figure 2:
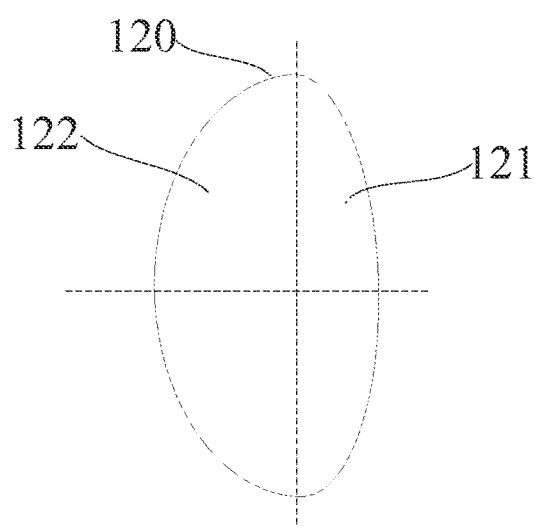
FIG. 2 illustrates a cross-section of the light bead shown in FIG. 1 that is perpendicular to the axis of the light bead.
Figure 3:
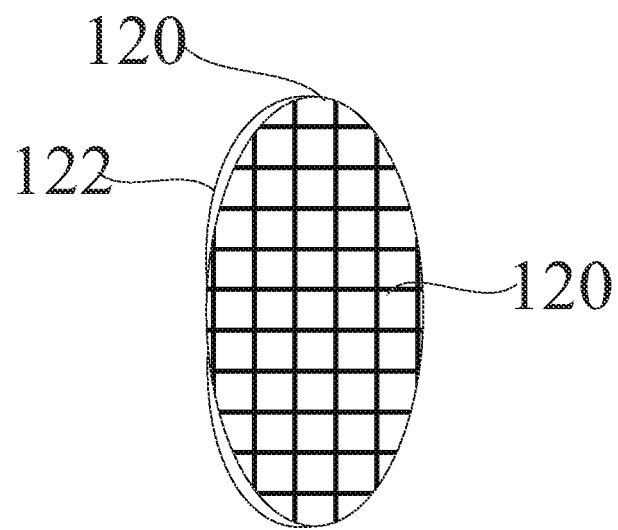
FIG. 3 is a bottom view of the LED shown in FIG. 1.

Referring now to FIG. 2 and FIG. 3, specifically in this embodiment, the asymmetric shape comprises two semi-ellipses with different curvatures. The symmetric shape is an ellipse. The axial cross-section of the light bead 120 comprises two semi-ellipses with different curvatures. Hence, the light bead 120 is not symmetric about the central normal of the light bead 120.

Specifically in this embodiment, the asymmetric shape comprises a first semi-ellipse 121 and a second semi-ellipse 122. A first semi-elliptical curve of the first semi-ellipse 121 and a second semi-elliptical curve of the second semi-ellipse 122 connect end to end. The curvature of the first semi-elliptical curve is different from that of the second semi-elliptical curve, and an intersection line of the first semi-ellipse 121 and the second semi-ellipse 122 intercepts with the normal of the lighting assembly 110. A major axis of the first semi-ellipse 121 is equal to that of the second semi-ellipse 122. A minor axis of the first semi-ellipse 121 is shorter than that of the second semi-ellipse 122. Also referring to FIG. 1, the outer surface of the light bead 120 comprises a first curved lighting surface 123 and a second curved lighting surface 124. The portion of the outer surface of the light bead 120 corresponding to the first semi-ellipse 121 is the first curved lighting surface 123, and the portion of the outer surface of the light bead 120 corresponding to the second semi-ellipse 122 is the second curved lighting surface 124. The curvature of the first semi-ellipse 121 is relatively smaller and the curvature of the second semi-ellipse 122 is relatively larger. A cross-section where the common major axis of the first semi-ellipse 121 and the second semi-ellipse 122 and the central normal of the light bead 120 lie is an asymmetric shape. Furthermore, the curvature of the first curved lighting surface 123 corresponding to the first semi-ellipse 121 is relatively smaller, and the curvature of the second curved lighting surface 124 corresponding to the second semi-ellipse 122 is relatively larger. Since the first curved lighting surface 123 and the second curved lighting surface 124 have different curvatures, the half-power angles corresponding to the first curved lighting surface 123 and the second curved lighting surface 124 are also different.

Figure 4:
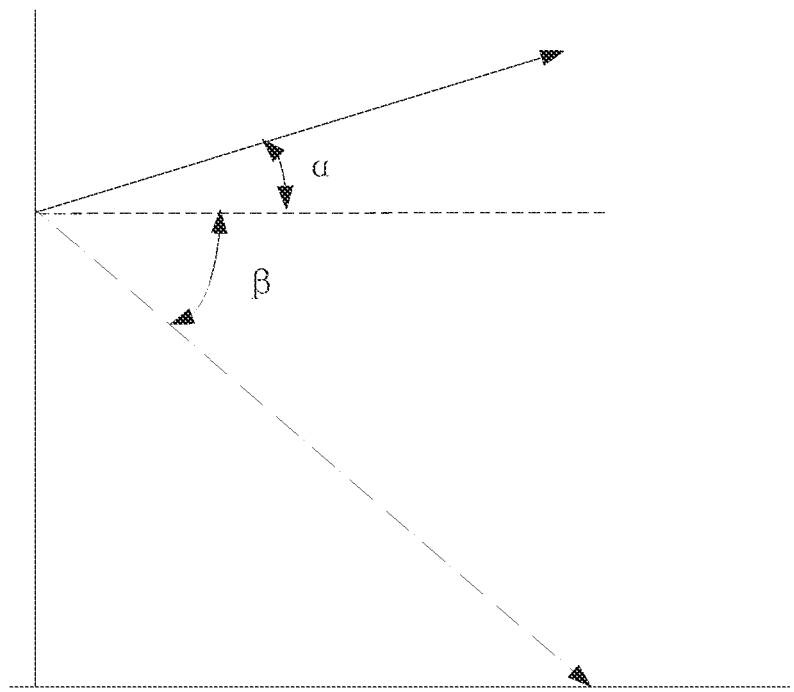
FIG. 4 is a schematic diagram illustrating a half-power angle of the LED shown in FIG. 1.

Since the curvature of the first semi-ellipse 121 is different from that of the second semi-ellipse 122, the curvature of the first curved lighting surface 123 is also different from that of the second curved lighting surface 124. Based on principles of optics, when light is incident on interfaces with different curvatures and thus refracted, the respective refraction angles of the light will also be different. Referring now to FIG. 1, according to the law of refraction, since the curvature of the first curved lighting surface 123 is relatively smaller, the light is refracted when passing through the first curved lighting surface 123. Referring also to FIG. 4, the half-power angle α corresponding to the first curved lighting surface 123 will be relatively smaller. While the curvature of the second curved lighting surface 124 is relatively larger, when light passes through the second curved lighting surface 124 and thus refracted, the half-power angle β corresponding to the second curved lighting surface 124 will be relatively larger. Based on different designing of curvatures of the first curved lighting surface 123 and the second curved lighting surface 124, the ratio of the half-power angle of the first curved lighting surface 123 to that of the second curved lighting surface 124 may lie in a range of 1:1.5~5. The second curved lighting surface 124 is arranged relatively closer to the ground and thus the first curved lighting surface 123 is relatively far away from the ground. Hence, the second curved lighting surface 124 with a relatively larger half-power angle will refract the light downward to form the lower half-power angle, namely, the half-power angle β is the lower half-power angle of the LED 100.

Figure 5:
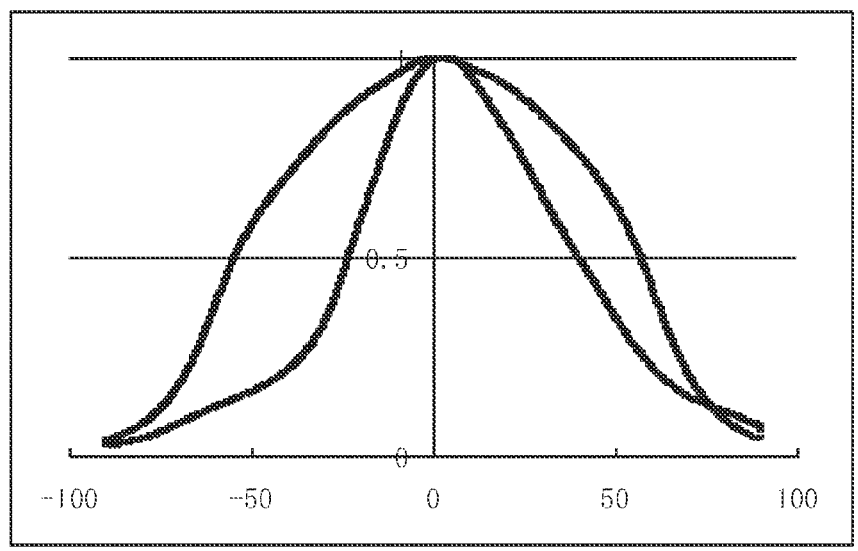
FIG. 5 is a simulation curve illustrating a vertical light-refraction of the LED shown in FIG. 1.

Since the half-power angle β of the second curved lighting surface 124 is relatively large, namely, the half-power angle of the LED 100 is increased, the visible range of the LED 100 will be enlarged accordingly, so as to better meet the requirements of low angle view. Referring now to FIG. 5, which is a simulation curve illustrating a vertical light-refraction of an LED 100 according to the disclosure. According to FIG. 5, the lighting patterns of the LED 100 on both sides of the normal are not symmetric.

Figure 6:
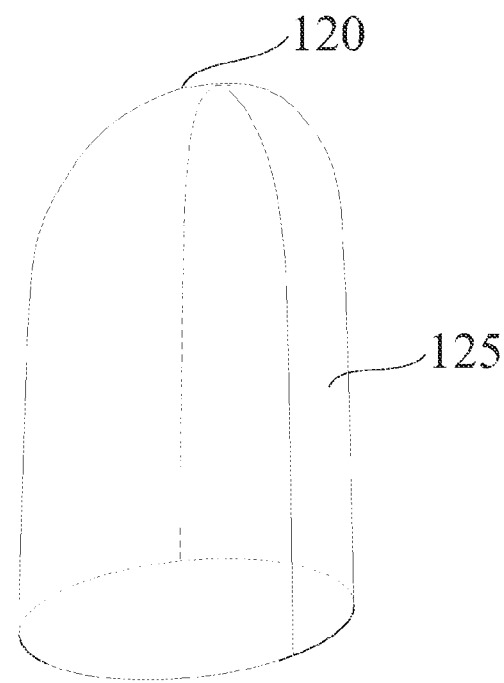
FIG. 6 is a perspective of the light bead of the LED as shown in FIG. 1.

Referring now to FIG. 6, the surface of the light bead 120 comprises four curved surfaces 125, which connect with each other to jointly form the surface of the light bead 120. Specifically in this embodiment, every adjacent two curved surfaces 125 of the four curved surfaces 125 connect with each other tangentially. Since the adjacent two curved surfaces 125 connect with each other tangentially, it can ensure a smooth surface of the light bead 120.

In this embodiment specifically, the light bead 120 is of epoxy resin.

An embodiment of the LED display screen comprises multiple LED dot matrix modules fitted together each comprising multiple pixel points each comprising multiple LEDs 100. The multiple LEDs 100 are arranged to form a pixel point. The side of the multiple LEDs 100 with the relatively lager half-power angle is arranged closer to the ground, enabling an observer on the ground to view the LED display screen with a relatively larger visual range. The color of the LED 100 may be red, green or blue. Each pixel point is comprised of LEDs 100 of red, green and blue. Since the LED 100 can increase the visible range, the LED display screen composed of the aforementioned LEDs 100 can also achieve a relatively larger visible range to better satisfy people's requirements of low angle view.

Figure 7:
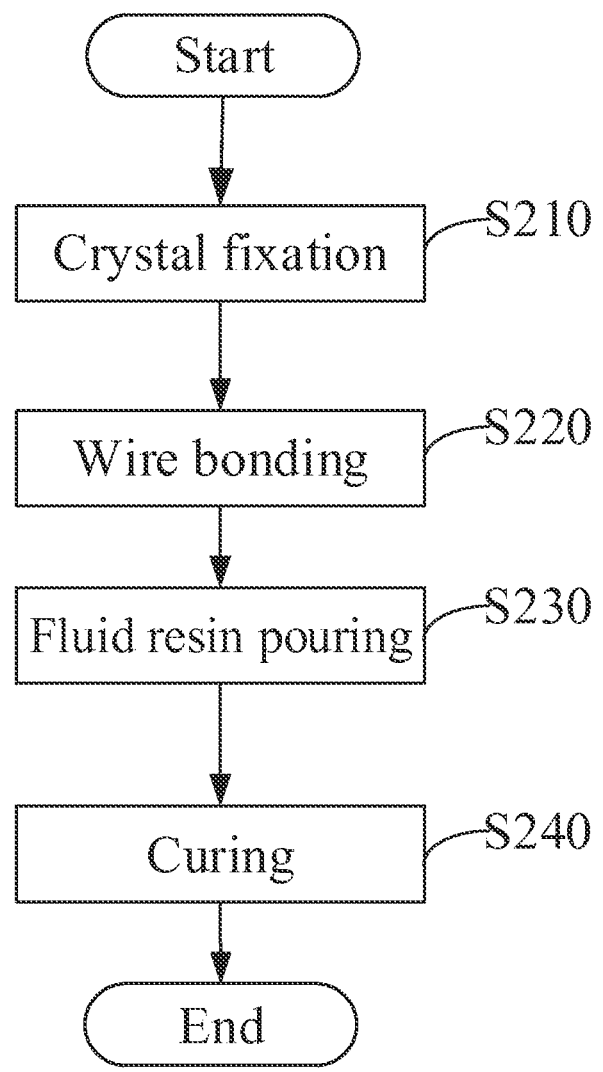
FIG. 7 is a flow chart illustrating an LED packaging method according to an embodiment of the disclosure.

Referring now to FIG. 7, an LED packaging method 200 is also provided.

The LED packaging method 200 comprises:

step S210: crystal fixation, where a chip is fixed onto a post;

step S220: wire bonding, where both terminals of a gold wire are welded respectively to the chip and the post;

step S230: liquid resin filling, where the chip and the post are placed in the mold which is then filled with fluid resin, a cross-section of the resin-filled cavity that is perpendicular to its axis is an asymmetric shape, and a cross-section at the opening of the resin-filled cavity that is perpendicular to its axis is a symmetric shape;

step S240: curing, where the fluid resin is cured to form the LED.

In the LED manufactured by the LED packaging method as aforementioned, the cross-section of the upper portion of the LED perpendicular to its axis is an asymmetric shape, and thus the curvature of the outer surface of the light bead 120 is not symmetric about the central normal of the light bead 120, namely the light-refraction of the light bead 120 is asymmetric and the facula generated by the light bead 120 is an asymmetric one. In addition, the cross-section at the lower portion of the light bead 120 that is perpendicular to its axis is a symmetric shape. Since the light-refraction of the light bead 120 is asymmetric, when the light bead 120 is cured and molded, the distribution of its internal stress is not uniform, causing the lighting assembly to be impacted, which thus will affect the configuration of the lighting assembly and connections therein. Rather, the lower portion of the light bead 120 is designed to be a symmetric shape, enabling the distribution of the internal stress of the light bead 120 to be relatively uniform. Hence, in the aforementioned LED 100, the facula shone from the light bead 120 is an asymmetric one, satisfying the requirements of half-power angle in everyday use of LED 100, and further preventing in the molding process of the light bead 120 the introduced liquid resin from flowing and impacting the lighting assembly and thus influencing the configuration of the lighting assembly and connections among the various components therein, which will otherwise damage the LED 100.

In addition, the lighting assembly is located at the center of the lower portion of the light bead 120. Since the cross-section at the lower portion of the light bead 120 is a symmetric shape and the lighting assembly is located at the center of the lower portion of the light bead 120, the resin surrounding the lighting assembly is symmetric about the lighting assembly. Hence, the internal stress of the lighting assembly is uniform, with a relatively high stability, so as to prevent, when the light bead is heated or an external force is applied on the light bead, the lighting assembly from detaching from the light bead which may influence the working of the LED 100.

The above embodiments are merely several implementations of the disclosure, and are given a relatively specific and detailed description. However, the above embodiments shall not be construed to be limiting the patentable scope of the present disclosure. It should be noted that, those of ordinary skill in the art may also make a number of modifications and improvements without departing from the concepts of the present disclosure, all of which shall fall within the protection scope of the present disclosure. Hence, the protection scope of the present disclosure shall be best defined by the appended claims.

What is claimed is:

1. An LED, comprising:
   a lighting assembly;
   a light bead configured to encase the lighting assembly, where a cross-section of an upper portion of the light bead perpendicular to its axis is an asymmetric shape with respect to a projection of a normal of the lighting assembly on the cross-section of the upper portion of the light bead;
   wherein a lower portion of the light bead is a symmetric shape and the lighting assembly is located at a central region of the lower portion of the light bead;
   wherein an outer surface of the upper portion of the light bead comprises a first curved lighting surface and a second curved lighting surface, a half-power angle corresponding to the first curved lighting surface is smaller than that corresponding to the second curved lighting surface;
   the asymmetric shape comprises a first semi-ellipse and a second semi-ellipse, a first semi-elliptical curve of the first semi-ellipse and a second semi-elliptical curve of the second semi-ellipse connect end to end, where a curvature of the first semi-elliptical curve is different from that of the second semi-elliptical curve, and an interception line of the first semi-ellipse and the second semi-ellipse intercepts with the normal of the light assembly;
   a major axis of the first semi-ellipse is equal to that of the second semi-ellipse, and a minor axis of the first semi-ellipse is shorter than that of the second semi-ellipse;
   a portion of the outer surface of the light bead corresponding to the first semi-ellipse is the first curved lighting surface, and a portion of the outer surface of the light bead corresponding to the second semi-ellipse is the second curved lighting surface, and a ratio of the half-power angle of the first curved lighting surface to that of the second curved lighting surface lies in a range of 1:1.5~5.

2. The LED according to claim 1, wherein the symmetric shape is an ellipse.

3. The LED according to claim 1, wherein an outer surface of the light bead comprises four curved surfaces which connect with each other.

4. The LED according to claim 3, wherein every two adjacent curved surfaces among the four curved surfaces connect with each other tangentially.

5. The LED according to claim 1, wherein the lighting assembly comprises a post and a chip disposed on the post.

6. The LED according to claim 5, wherein the post is located at the central region of the lower portion of the light bead.

7. An LED packaging method, comprising:
   crystal fixation, where a chip is fixed onto a post;
   wire bonding, where both terminals of a gold wire are welded respectively to the chip and the post;
   fluid resin filling, where the chip and the post are placed in a mold which is then filled with fluid resin, a cross-section of a resin-filled cavity perpendicular to its axis is an asymmetric shape, and a cross-section of an opening of the resin-filled cavity that is perpendicular to its axis is a symmetric shape;
   curing, where the fluid resin is cured to form an LED;
   wherein the LED formed in the curing comprises a light bead which is the resin cured, and an outer surface of an upper portion of the light bead comprises a first curved lighting surface and a second curved lighting surface, a half-power angle corresponding to the first curved lighting surface is smaller than that corresponding to the second curved lighting surface;
   the asymmetric shape comprises a first semi-ellipse and a second semi-ellipse, a first semi-elliptical curve of the first semi-ellipse and a second semi-elliptical curve of the second semi-ellipse connect end to end, where a curvature of the first semi-elliptical curve is different from that of the second semi-elliptical curve, and an interception line of the first semi-ellipse and the second semi-ellipse intercepts with the normal of the light assembly;
   a major axis of the first semi-ellipse is equal to that of the second semi-ellipse, and a minor axis of the first semi-ellipse is shorter than that of the second semi-ellipse;
   a portion of the outer surface of the light bead corresponding to the first semi-ellipse is the first curved lighting surface, and a portion of the outer surface of the light bead corresponding to the second semi-ellipse is the second curved lighting surface, and a ratio of the half-power angle of the first curved lighting surface to that of the second curved lighting surface lies in a range of 1:1.5~5.

8. The LED packaging method according to claim 7, wherein the symmetric shape is an ellipse.

9. The LED packaging method according to claim 7, wherein an internal surface of the resin-filled cavity comprises four curved surfaces which connect with each other.

10. The LED packaging method according to claim 9, wherein every two adjacent curved surfaces among the four curved surfaces connect with each other tangentially.

11. The LED packaging method according to claim 7, wherein the LED formed in the curing further comprises a lighting assembly which comprises the chip and the post, and the post is located at a central region of a lower portion of the light bead.

* * * * *